United States Patent [19]

Lee

[11] 4,193,182

[45] Mar. 18, 1980

[54] PASSIVATED V-GATE GaAs FIELD-EFFECT TRANSISTOR AND FABRICATION PROCESS THEREFOR

[75] Inventor: Don H. Lee, Agoura, Calif.

[73] Assignee: Hughes Aircraft Company, Culver City, Calif.

[21] Appl. No.: 883,978

[22] Filed: Mar. 6, 1978

Related U.S. Application Data

[62] Division of Ser. No. 766,325, Feb. 7, 1977, Pat. No. 4,156,879.

[51] Int. Cl.$^2$ .............................................. B01J 17/00
[52] U.S. Cl. ................................... 29/571; 29/576 B; 357/91
[58] Field of Search .................... 29/571, 578, 576 B; 357/91

[56] References Cited

U.S. PATENT DOCUMENTS

| | | | |
|---|---|---|---|
| 3,413,531 | 11/1968 | Leith | 29/576 B |
| 3,523,042 | 8/1970 | Bower | 29/576 B |
| 3,775,191 | 11/1973 | McQuhae | 29/571 |
| 4,003,126 | 1/1977 | Holmes | 29/571 |

*Primary Examiner*—W. C. Tupman

*Attorney, Agent, or Firm*—William J. Bethurum; W. H. MacAllister

[57] ABSTRACT

The specification describes a new and improved Schottky-gate field-effect transistor (FET) and process for fabricating same wherein selective and multiple ion implanatation doping steps are used to form source, drain and channel regions in a semiconductor body. The semiconductor body is then selectively etched to expose the source and drain regions previously formed, while leaving intact a mesa-shaped, high resistivity stabilizing region of the semiconductor body overlying and electrically stabilizing the ion-implanted channel region. The semiconductor body is then partially passivated with a chosen dielectric layer having two openings therein for exposing source and drain regions, respectively, and a third opening which is aligned with the channel region. Ohmic contacts are deposited in the source and drain openings, and thereafter a V-shaped groove is etched in the mesa-shaped region overlying the channel region to expose a very small area of the channel region. Schottky-gate metallization is then deposited in this V-shaped groove to form the Schottky-gate electrode of the device, and the fully passivated device thus formed exhibits excellent source and drain contact resistance and a minimum of drain-to-gate capacitance.

4 Claims, 9 Drawing Figures

PASSIVATED V-GATE GAAS FIELD-EFFECT TRANSISTOR AND FABRICATION PROCESS THEREFOR

This is a division of application Ser. No. 766,325, filed Feb. 7, 1977, now U.S. Pat. No. 4,156,879.

FIELD OF THE INVENTION

This invention relates generally to Schottky-gate field-effect transistors and related fabrication processes, and more particularly to a passivated V-gate field-effect transistor with improved passivation and electrical contact characteristics and an improved high frequency performance.

BACKGROUND

In recent years, substantial efforts have been made toward improving the electrical characteristics, reliability and high frequency performance of certain types of field-effect transistors (FETs) and particularly Schottky-gate, GaAs field-effect transistors. These Schottky-gate, GaAs FETs have recently been used to replace the more expensive parametric amplifiers and travelling wave tubes and also some analagous silicon devices, and these new FETs have demonstrated an improved electrical performance, longer operating life, and greater design flexibility relative to these earlier devices. For example, a TWT tube lasts approximately 1,000 hours, whereas GaAs FETs have been rated at more than 20,000 hours lifetime.

Additionally, many technical articles have appeared in recent months describing various types and features of the latest, state of the art GaAs FETs. Typical of these technical articles is a recent publication by Stacey V. Bearse in *Microwaves,* February 1976 entitled "GaAs FETs: Device Designers Solving Reliability Problems", at page 32. This rather extensive article, as well as the many reference articles noted on page 52 thereof, are incorporated fully herein by reference. Some of these latest state of the art GaAs FETs have been constructed using selected ion implantation doping techniques as evidenced by the GaAs FETs described in U.S. Pat. Nos. 3,914,784 and 3,912,546, issued to R. G. Hunspurger and both assigned to the present assignee. Thus, as is apparent from this prior work, the desirability for further improving the reliability, electrical characteristics and overall operational performance of these high frequency field-effect transistors is manifest.

FIGS. 1 and 2 of the drawings illustrate two specific prior approaches to GaAs FET device fabrication, and these two approaches will be discussed in more detail below with specific reference to these prior art figures. However, from a mere inspection of these prior devices shown in FIGS. 1 and 2, it will be observed that the device of FIG. 1 is an electrically unpassivated device, whereas the passivated structure of FIG. 2 exhibits an obvious undesirable drain-to-gate overlap capacitance which inherently limits the high frequency performance of this device. Another operational disadvantage of the devices shown in FIGS. 1 and 2 is the current crowding at the drain and source because of the metal contact geometry at the FET channel region.

THE INVENTION

The general purpose of this invention is to provide a new and improved passivated Schottky-gate, field-effect transistor and fabrication process therefor which specifically overcomes the above-identified disadvantages of the device structures of prior art FIGS. 1 and 2. At the same time, the device embodying the present invention exhibits a much improved reliability relative to the above-identified prior art structures.

To accomplish this purpose, I have discovered and therefore developed a novel field-effect transistor structure and semiconductor fabrication process therefor wherein a semiconductor body is doped using multiple ion implantation and masking techniques to form an implanted buried layer within the body and consisting of heavily doped source and drain regions separated by a lightly doped channel region. Using a selective etching process, a high resistivity semiconductor mesa-passivation region is created atop the lightly doped channel region, and a narrow opening is formed therein which exposes a small area of the channel region for Schottky-gate metallization. A dielectric passivation layer is formed atop portions of the source, drain and mesa-passivation regions and has openings therein for receiving ohmic contact metallization in direct contact with the source and drain regions and Schottky-gate metallization in direct contact with the channel region. Thus, the dielectric passivation layer and the passivating semiconductor mesa provide a maximum of electrical stability for the device, and the small area Schottky-gate contact formed in the narrow opening in the semiconductor mesa produces an absolute minimum of parasitic capacitance for the device. In a preferred embodiment of the invention, the narrow opening in the semiconductor mesa for receiving the Schottky-gate contact is in the shape of a V-groove. This groove may be formed using an anisotropic etchant which preferentially etches along certain crystallographic planes into the semiconductor mesa to expose only a small area of the channel region for the Schottky-gate contact.

Accordingly, it is an object of the present invention to provide a new and improved Schottky-gate field-effect transistor which exhibits an improved high frequency performance.

Another object of the invention is to provide a new and improved Schottky-gate field-effect transistor having improved electrical passivation characteristics and thus exhibiting improved electrical performance and device reliability.

Another object of the invention is to provide a field-effect transistor of the type described having high gain and low noise characteristics relative to similar state-of-the-art field-effect transistors.

Another object is to provide a field-effect transistor of the type described having electrical passivation for active device regions which provides maximum immunity to all normally encountered environments in which the device will operate.

Another object is to provide a new and improved field-effect transistor of the type described having improved, long-term stability of such FET parameters as low and high frequency gain, device transfer characteristics and the like.

A further object of the invention is to provide a field-effect transistor of the type described having improved source and drain contact resistance which insures a minimum of current crowding and a minimum of undesirable parasitic capacitance.

Yet another object of the invention is to provide a novel fabrication process for constructing Schottky-gate FETs with the ability to form submicron gate widths using presently available one to two micrometer photolithographic techniques. This capability is quite significant in that state of the art high frequency FETs can be formed without requiring complicated and expensive high resolution lithographic equipment such as is presently used in electron beam and x-ray lithography.

A novel feature of this invention is the provision of a channel region of a Schottky gate FET which, with the exception of the portion thereof exposed to the Schottky gate contact, is wholly within the interior of a semiconductor crystal. Thus, the semiconductor crystal surrounding this channel region provides a maximum of electrical passivation and stabilization for the device, and the fact that channel current flows beneath the semiconductor surface minimizes the FET noise.

Another feature of this invention is the provision of a Schottky-gate FET with heavily doped N+ contact regions immediately adjacent to a buried N-type channel region. This construction provides lateral current flow from drain-to-source and thus minimizes current crowding effects.

Another feature of this invention is the provision of an autoregistration masking and ion implantation process for forming the FET channel with a lateral dimension which is completely independent of channel mask alignment.

These and other objects, advantages and features of the invention will become more readily apparent in the following description of one process embodiment and one device embodiment of the invention.

DETAILED DESCRIPTION

Figure 1:
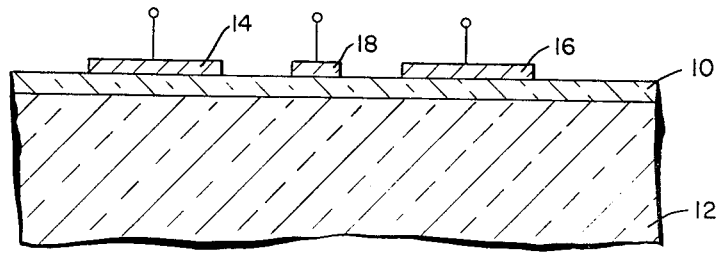
FIG. 1 is a cross-section view of one prior art unpassivated Schottky-gate FET which will be described in connection with the overall explanation and description of the present invention.

Referring now to FIG. 1, there is shown one prior art Schottky-gate field-effect transistor of the type having either an N type epitaxial layer or ion implanted channel 10 formed on or in a semi-insulating GaAs substrate 12. The epitaxial or ion-implanted layer 10 includes the source, drain and channel regions for the Schottky-gate FET, and source, drain and Schottky-gate contacts 14, 16 and 18 are formed as shown atop the surface of the layer 10, using known ohmic contact and Schottky-gate contact deposition techniques. As is well known, current flows between source and drain contacts 14 and 16 when the device is in operation, and a gate voltage applied to the Schottky-gate contact 18 may be used to modulate and control the source-to-drain current flow. This device is described in more detail in a textbook by S. Sze entitled *Physics of Semiconductor Devices*, page 410, John Wiley & Sons, New York, 1969. One obvious disadvantage of this structure is that its upper surface is not passivated with some form of dielectric layer, thus leaving the source, drain and channel regions of the device exposed to possibly adverse environments.

Figure 2:
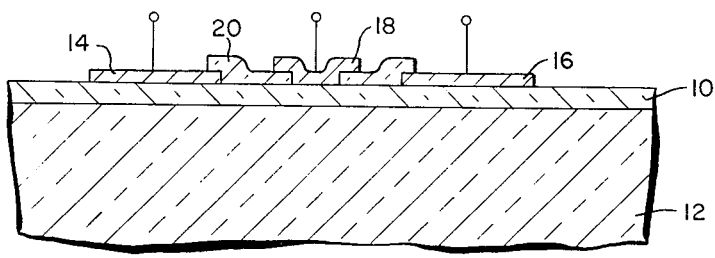
FIG. 2 is a cross-section view of another prior art passivated Schottky-gate FET, which, like the structure in FIG. 1, exhibits certain disadvantages which have been overcome by the present invention.

In order to provide some form of surface passivation and stabilization for the type of device shown in FIG. 1, a surface layer of dielectric passivation, such as silicon dioxide layer 20, may be used as shown in FIG. 2 to at least provide some passivation between source, drain and gate electrodes of the device. However, this dielectric layer 20 in FIG. 2 forms part of a gate-to-source and gate-to-drain parasitic capacitance which degrades the high frequency performance of this device. Another disadvantage common to the prior art FET structures of FIGS. 1 and 2 is current crowding at the drain and source contacts between the metallization is alloyed directly to the lightly doped N-type channel region at the top surface. As will become more fully apparent in the following description of FIG. 3, the process and ultimate device structure according to the present invention eliminates the above-described disadvantages associated with the prior art devices in FIGS. 1 and 2. The prior art structure in FIG. 2 is described in more detail in an article by M. Fukuta entitled, "Improved Devices Debut at Solid State Conference", *Microwaves*, p. 10, April 1976.

Figure 3A:
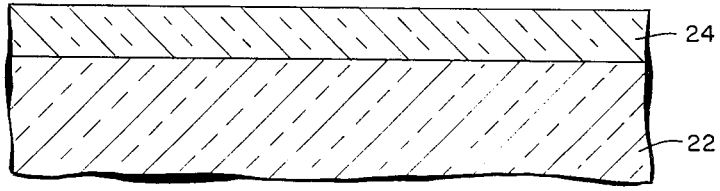
FIGS. 3a through 3g illustrate a preferred process sequence according to the present invention, and the structure of FIG. 3g is the resultant novel, Schottky-gate FET to be described.

Referring now in succession to FIGS. 3a through 3g, there is shown in FIG. 3a a semi-insulating GaAs substrate 22 of [100] crystallographic orientation and upon which an epitaxial GaAs layer 24 has been deposited using known epitaxial deposition techniques. While the specific embodiment of the invention described herein utilizes GaAs, it is to be understood that silicon or other suitable semiconductor materials may also be used in practicing the present fabrication process. Additionally, the present invention is not limited, materials wise, to either the particular dielectric passivating materials or to the particular contact metallizations or alloys to be specified. Preferably, the epitaxial layer 24 has a high resistivity near its intrinsic value, and the substrate or starting material 22 is typically a chromium-doped semi-insulating GaAs substrate having a resistivity typically greater than about $10^5$ ohm-centimeters.

Figure 3B:
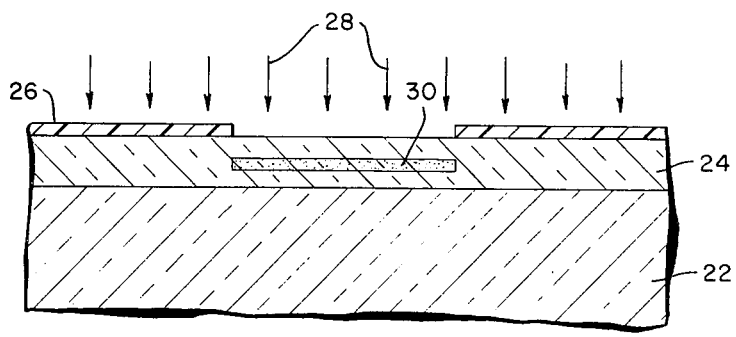

The structure in FIG. 3a is masked with a suitable photoresist pattern 26 as shown in FIG. 3b and then transferred to a suitable ion-implantation doping station wherein N type ions 28, such as sulfur or silicon ions, are implanted using a predetermined dose-energy schedule to form an N type buried layer 30 for the FET channel below the surface of the previously formed epitaxial layer 24. State-of-the-art ion-implantaton doping techniques such as, for example, those described in *Ion Implantation* by G. Dearnaley et al, Amsterdam, The Netherlands: North Holland, 1973, enable the N type buried layer 30 to be formed at a precise dosage, thickness and depth beneath the surface of the epitaxial layer 24. The channel depth will be typically on the order of 0.7 micrometer for the present GaAs FET to be described, and its thickness (vertical dimension) will typically be about 0.4 micrometer.

Figure 3C:
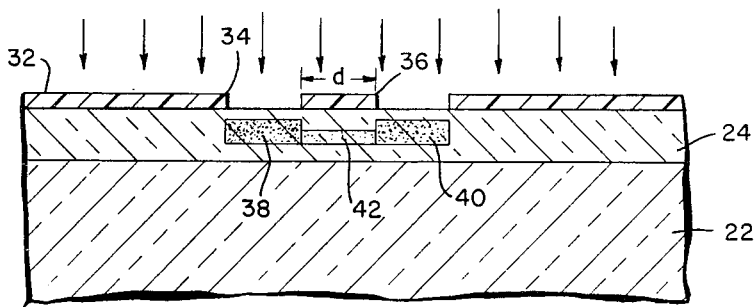

After completion of the ion-implantation step to form the channel region as illustrated in FIG. 3b, the photoresist mask 26 is removed from the semiconductor surface using a suitable solvent such as, for example, a xylene or a butyl acetate, and then the implanted structure is again masked, as shown in FIG. 3c, in preparation for the formation and completion of source and drain regions of the device. The mask 32 in FIG. 3c is a photoresist mask (such as Kodak Thin Film Resist, KTFR) with openings 34 and 36 therein corresponding to the locations of the source and drain regions of the device. The source and drain regions 38 and 40 are completed by an additional N type ion-implantation doping step and using the same incident ion energy as in the previous ion-implantation doping step of FIG. 3b above. This additional N type ion-implantation doping step thus serves to form the rather heavily doped N+ source and drain regions 38 and 40 which are now separated by a rather lightly doped N type channel region 42 as shown in FIG. 3c. Although the heavily doped regions 38 and 40 are shown beneath the surface of the semiconductor crystal in FIG. 3c, the ion implantation dose-energy schedule may be appropriately adjusted to bring these N+ regions up to the semiconductor crystal surface. In such case, it would not then be necessary to etch down into the semiconductor crystal to expose these N+ regions for source and drain ohmic contact.

Figure 3D:
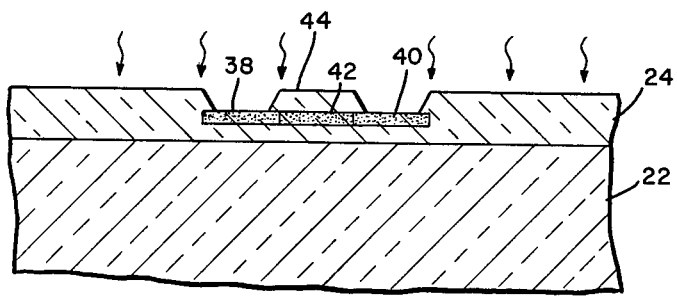

The structure of FIG. 3c is then transferred with the photoresist mask 32 intact to an etching station where a suitable GaAs etchant is applied to the upper surfaces of the structure to etch down into the structure and expose portions of the source and drain regions 38 and 40. During this process, the semiconductor mesa region 44 is created as shown in FIG. 3d. However, in FIG. 3d the photoresist mask 32 is shown removed upon completion of the above etching step, and this etching step is a controlled etching step wherein the etching is terminated when the etchant reaches the known location of the heavily doped N+ source and drain regions 38 and 40. This etching step is typically carried out in a bromine-methanol system wherein the etchant is $CH_3OH$ plus about 5 percent by weight of bromine added thereto. The structure in FIG. 3d is then annealed (the arrows in FIG. 3d represent this heat treatment) at a predetermined elevated temperature on the order of about 800° C. for about 20 minutes to remove lattice damage and to bring the implanted regions of the device to full electrical activity. This annealing procedure which is carried out in a controlled atmosphere is generally known and may, for example, be of the type disclosed by R. M. Malbon et al in an article entitled, "Annealing of Ion Implanted GaAs in a Controlled Atmosphere", *Journal of the Electrochemical Society*, Vol. 123, No. 9, September 1976 at pages 1413–1415. This article, as well as the various publications therein, are incorporated herein by reference.

Figure 3E:
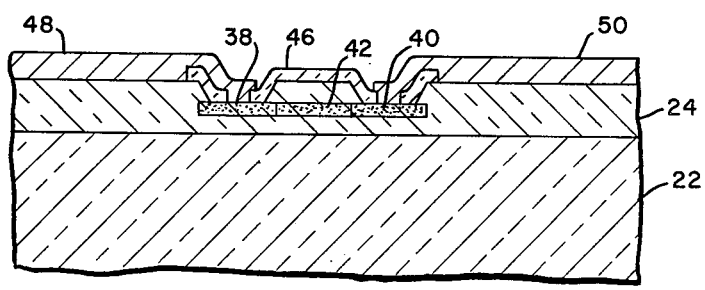

The structure of FIG. 3d is then transferred to an oxide deposition station wherein initially a thin passivating dielectric layer such as silicon dioxide (not shown) is formed over the entire upper surface of the structure. A silicon dioxide passivation layer may be formed using standard oxide deposition techniques, such as a well known SILOX process which is described in some detail in the above patents issued to R. G. Hunsberger et al and assigned to the present assignee. Thereafter, using standard photoresist masking and etching procedures, source and drain contact openings are formed in this passivation layer 46 as shown in FIG. 3e. Then, source and drain ohmic contacts 48 and 50 are deposited on the surfaces of the source and drain regions, and these contacts are subsequently alloyed into the N+ source and drain implanted regions using standard state-of-the-art alloying techniques.

Figure 3F:
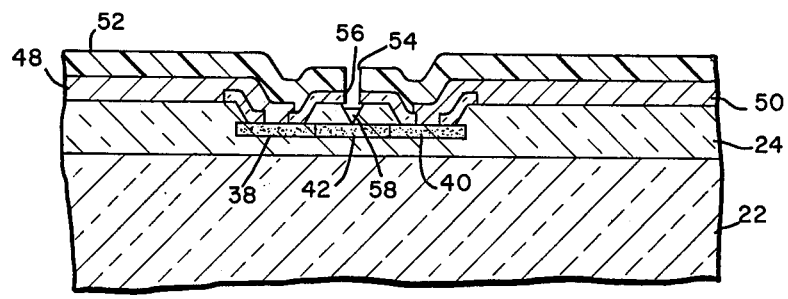
Figure 3G:
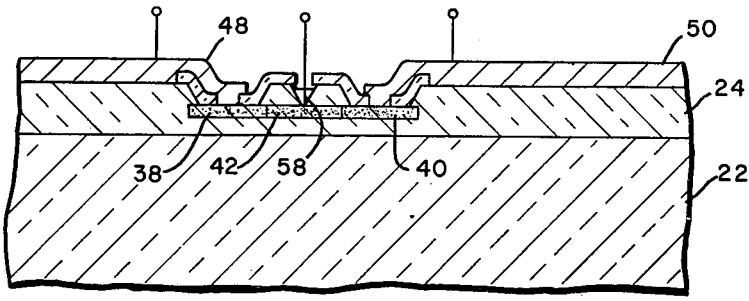

Once the source and drain contact metallization patterns 48 and 50 have been alloyed into the semiconductor surface, the structure of FIG. 3e is again transferred to a photoresist masking station where another photoresist mask 52 is formed on the upper surface thereof, as shown in FIG. 3f, and has an opening 54 therein which is located at the approximate center of the device's channel region 42. This opening 54 in the photoresist layer 52 is then exposed to a suitable $SiO_2$ etchant such as dilute HF which is used to etch an opening 56 in the underlying $SiO_2$ passivation mask 46. Once this step is completed, a selected etchant such as $CH_3OH\cdot Br$ as identified above is applied through the opening 54 and to the upper surface of the semiconductor mesa 44 which is now exposed by the openings 54 and 56 in the photoresist and $SiO_2$ layers respectively. This etchant preferentially etches the exposed semiconductor mesa 44 in the V-groove geometry shown in FIG. 3f until it reaches the lightly doped, N type channel region of the structure where the etching is terminated. For a further discussion of V-groove etching of GaAs, reference may be made to the following articles by Y. Tauri et al: Y. Tarui et al, "Self Aligned GaAs Schottky Barrier Gate FET Using Preferential Etching", Electrotechnical Laboratory, Tanashi, Tokyo and Y. Tarui et al, "Preferential Etching of GaAs and Its Application to Devices", Proc. 2nd Conf. on Solid State Devices, J. of the Japan Society of Applied Physics, Vol. 41, 1971.

When this preferential controlled V-groove etching step has been completed, a suitable Schottky-gate metallization pattern such as aluminum is deposited, as shown in FIG. 3f, to form the V-shaped Schottky-gate contact 58 on the upper surface of the V-grooved semiconductor mesa 44 and in Schottky contact with the channel region 42. When this Schottky-gate metallization step has been completed, the structure of FIG. 3f is transferred to a photoresist removal station where the photoresist mask 52 is removed using a suitable solvent and standard resist lift off techniques to thereby produce the resultant device structure shown in FIG. 3g. The source, drain and channel regions of this completed device are not only totally passivated with the $SiO_2$ layer, but are also completely stabilized by the presence of the remaining surrounding high resistivity epitaxial layer 24 and also by the presence of the remaining V-grooved semiconductor mesa which completely covers the device channel region 42. However, due to the thickness and resistivity of the semiconductor mesa remaining on the channel region 42, as shown in 3g, the drain-to-gate and source-to-gate parasitic capacitance of the device is also minimized.

Various process modifications may be made in the above described embodiments of the invention without departing from the true spirit and scope thereof. For example, the heavily doped source and drain regions of a device under construction may be implanted to either greater or lesser depths than those shown in the drawing in order to vary the device operating characteristics or to change the particular vertical location at which the source and drain ohmic contacts meet with these heavily dope source and drain regions. In fact, ion implantation dose-energy schedules may be modified by one skilled in the art so as to bring the heavily doped source and drain regions all the way to the surface of the ion implanted epitaxial layer. Thus, for this latter alternative processing technique, one could form a buried channel structure without even requiring the previously described mesa etching step, and the device resulting from this alternative process would have a planar upper surface. That is, the upper surface of the finally doped epitaxial layer could be provided with an oxide mask with openings therein for the source gate and drain electrodes. But, the same V-groove etching step of FIG. 3f above could be used in this alternative process to expose the lightly doped buried channel region for directly receiving a Schottky gate electrode as it is deposited in the previously formed V-groove extending into the epitaxial layer. However, the alternative final device structure resulting from this suggested process modification would have a greater drain-to-gate and source-to-gate parasitic capacitance than that exhibited by the preferred device structure of FIG. 3g.

What is claimed is:

1. A process for fabricating a field-effect transistor which includes the steps of:
    (a) implanting selected conductivity-type determining ions through one surface of a semiconductor body to form a buried layer therein,
    (b) masking said surface to define source, drain and channel regions within the previously formed buried layer,
    (c) implanting additional ions into selected regions of said buried layer to define heavily doped source and drain regions interconnected by a lightly doped channel region,
    (d) removing portions of said semiconductor body overlying said source and drain regions to thereby expose same for electrical contacts, while leaving intact a semiconductor mesa configuration covering and passivating said channel region,
    (e) forming a passivation layer atop said source, drain and mesa regions and having openings therein aligned with electrical contact areas for said source, drain and channel regions,
    (f) removing a predetermined portion of said semiconductor mesa to expose a small predetermined area of said channel region for electrical contact, and
    (g) depositing ohmic contact metallization on said source and drain regions, and further depositing Schottky-gate metallization in the removed portion of said semiconductor mesa and on an exposed area of said channel region.

2. The process defined in claim 1 wherein the formation of an opening in said semiconductor mesa includes preferentially etching through said semiconductor mesa to form a V-shaped groove therein for receiving Schottky-gate metallization in electrical contact with said channel region.

3. A process for fabricating a field-effect transistor which includes the steps of:
    (a) implanting selected conductivity-type determining ions through one surface of a semiconductor body to a form a buried layer therein,
    (b) masking said surface to define source, drain and channel regions within the previously formed buried layer,
    (c) implanting additional ions into selected regions of said buried layer to define heavily doped source and drain regions interconnected by a lightly doped channel region and controlling the vertical extent of said source and drain regions in accordance with the ion implantation dose-energy schedule,
    (d) forming a passivation layer on the surface of said semiconductor body and having openings therein aligned with electrical contact areas for said source, drain and channel regions,
    (e) depositing ohmic contact metallization on said source and drain regions,
    (f) removing a predetermined portion of said semiconductor body overlying said channel region to expose a predetermined area of said channel regions for electrical contact, and
    (g) depositing Schottky-gate metallization in the removed portion of said semiconductor body and on an exposed area of said channel region, whereby said channel region is buried within said semiconductor body and minimizes device noise otherwise caused by surface currents in said channel region, and the geometry of said source, drain and channel regions minimizes current crowding effects at the source and drain contact regions.

4. The process defined in claim 3 which also includes selectively etching said semiconductor body to form a semiconductor mesa region overlying said channel region, and forming a V-shaped groove in and through said mesa region for receiving Schottky-gate metallization in electrical contact with said channel region.

* * * * *